(12) United States Patent
Li et al.

(10) Patent No.: US 10,950,597 B2
(45) Date of Patent: Mar. 16, 2021

(54) ELECTROSTATIC PROTECTION CIRCUIT AND A SEMICONDUCTOR STRUCTURE

(71) Applicant: Shanghai Huali Microelectronics Corporation, Shanghai (CN)

(72) Inventors: Mingliang Li, Shanghai (CN); Xiaoming Hu, Shanghai (CN)

(*) Notice: Subject to any disclaimer, the term of this patent is extended or adjusted under 35 U.S.C. 154(b) by 0 days.

(21) Appl. No.: 16/566,875

(22) Filed: Sep. 11, 2019

(65) Prior Publication Data

US 2020/0176439 A1    Jun. 4, 2020

(30) Foreign Application Priority Data

Nov. 29, 2018 (CN) .......................... 201811446520.X (51) Int. Cl.
*H01L 23/62* (2006.01)
*H01L 27/02* (2006.01)
*H01L 27/06* (2006.01)
*H01L 27/08* (2006.01)

(52) U.S. Cl.
CPC ...... *H01L 27/0255* (2013.01); *H01L 27/0292* (2013.01); *H01L 27/0676* (2013.01); *H01L 27/08* (2013.01)

(58) Field of Classification Search
CPC . H01L 27/08; H01L 27/0255; H01L 27/0292; H01L 27/0676
See application file for complete search history.

(56) References Cited

U.S. PATENT DOCUMENTS

| | | | |
|---|---|---|---|
| 5,949,634 A * | 9/1999 | Yu .................. | H01L 27/0262 361/111 |
| 2010/0289588 A1* | 11/2010 | Satoh .................. | H03K 3/011 331/57 |
| 2013/0107402 A1* | 5/2013 | Wang .................. | H02H 9/046 361/56 |

* cited by examiner

*Primary Examiner* — Phuc T Dang
(74) *Attorney, Agent, or Firm* — Kilpatrick Townsend & Stockton, LLP (57) ABSTRACT

The present disclosure relates to the field of integrated circuits protection, and specifically discloses an electrostatic protection circuit and a semiconductor structure. The electrostatic protection circuit is disposed between a first port and a second port that require electrostatic protection, comprising at least one interdigital loop and a control circuit electrically connected to the interdigital loop. The interdigital loop comprises an electrostatic protection transistor having a drain electrically connected to the first port and a source electrically connected to the second port. The control circuit comprises a first transistor and a second transistor. The drain of the first transistor and the gate of the second transistor are electrically connected to the first port. The drain of the second transistor and the gate of the first transistor are electrically connected to the second port.

5 Claims, 5 Drawing Sheets

ELECTROSTATIC PROTECTION CIRCUIT AND A SEMICONDUCTOR STRUCTURE

CROSS-REFERENCES TO RELATED APPLICATIONS

The present application claims priority to Chinese Patent Application No. 201811446520.X, filed on Nov. 29, 2018, entitled "AN ELECTROSTATIC PROTECTION CIRCUIT AND A SEMICONDUCTOR STRUCTURE", which is incorporated by reference herein for all purposes.

TECHNICAL FIELD

The present disclosure relates to the field of integrated circuits protection, and specifically discloses an electrostatic protection circuit and a semiconductor structure.

BACKGROUND OF THE INVENTION

The phenomenon of electrostatic discharge (ESD) is very common in semiconductor manufacturing processes. The excess charge introduced by ESD can be transmitted to the integrated circuit via the I/O pins in a very short time, thereby damaging the internal circuit of the integrated circuit and causing huge losses.

Figure 1:
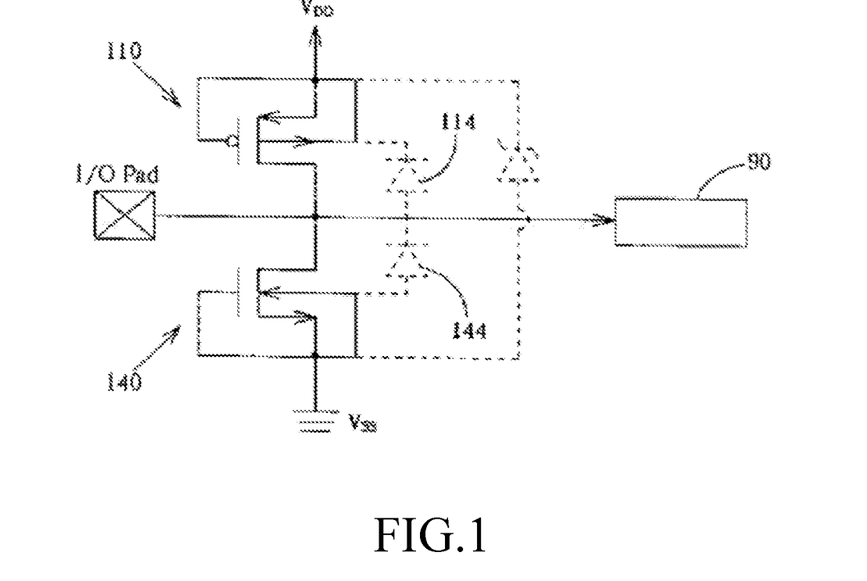
FIG. 1 shows a conventional internal protection circuit.

Providing electrostatic protection for the integrated circuits is an effective means of improving the reliability of integrated circuit products. The protection circuit shown in FIG. 1 is a common embodiment of electrostatic protection design, and the embodiment is provided in an application with patent application Ser. No. 02/153,974.X. The embodiment realizes the electrostatic protection between the I/O bond pad and the ground VSS with the second transistor 140, and realizes the electrostatic protection between the I/O bond pad and the power source VDD with the first transistor 110. In the embodiment, a second parasitic diode 144 is present in the second transistor 140, and a first parasitic diode 114 is present in the first transistor 110.

In the case where the integrated circuit of above embodiment operates normally, it is assumed that the power source voltage VDD is 2.5V and the ground voltage VSS is 0V. The second parasitic diode 144 in the second transistor 140 may be forward conducted when the I/O pad voltage is negative (i.e., −2.5 V), thereby generating a large leakage current between VSS and the I/O pad. The first parasitic diode 114 in the first transistor 110 may be forward conducted when the I/O pad voltage is positive (i.e., +5 V), thereby generating a large leakage current between the I/O pad and VDD. The leakage current will seriously affect the input of the reverse voltage in the integrated circuit, and limit the applicable range of the electrostatic protection circuit.

Therefore, there is a need in the art for a new technology to solve the problem of leakage current caused by the input of positive voltage or negative voltage in the prior art, and the problem of weak capability on reverse electrostatic protection in the prior art.

BRIEF SUMMARY OF THE INVENTION

A brief overview of one or more aspects is provided below to provide a basic understanding of these aspects. The summary is not an extensive overview of all of the aspects that are contemplated, and is not intended to identify key or decisive elements in all aspects. The sole purpose of the summary is to present some concepts of one or more aspects in a simplified form as a prelude to the more detailed description that is presented later.

In order to solve the problem of leakage current when positive voltage or negative voltage is input, and the problem of weak capability on reverse electrostatic protection, the present disclosure provides an electrostatic protection circuit that is compatible with both positive and negative voltage inputs, and capable of effectively performing two-way electrostatic protection, as well as a corresponding semiconductor structure for same.

The electrostatic protection circuit provided in the present disclosure may be disposed between a first port and a second port that require electrostatic protection, and may comprise at least one interdigital loop and a control circuit electrically connected to the at least one interdigital loop; and each of the at least one interdigital loop may comprise an electrostatic protection transistor, and a drain of the electrostatic protection transistor is electrically connected to the first port, and a source of the electrostatic protection transistor is electrically connected to the second port;

the control circuit comprises a first transistor and a second transistor, and a drain of the first transistor and a gate of the second transistor are electrically connected to the first port, a drain of the second transistor and a gate of the first transistor are electrically connected to the second port, and a source of the first transistor is shorted to a source of the second transistor and electrically connected to a gate and a body region of the electrostatic protection transistor.

According to the electrostatic protection circuit provided in the present disclosure, each of the at least one interdigital loop may further comprise a first current limiting resistor connected between the drain of the electrostatic protection transistor and the first port, and a second current limiting resistor connected between the source of the electrostatic protection transistor and the second port.

According to the electrostatic protection circuit provided in the present disclosure, the electrostatic protection transistor comprised in each interdigital loop, and the first transistor and the second transistor comprised in the control circuit may be metal oxide semiconductor (MOS) transistors in same type.

According to the electrostatic protection circuit provided in the present disclosure, the electrostatic protection transistor comprised in each interdigital loop, and the first transistor and the second transistor comprised in the control circuit are all NMOS transistors; or the electrostatic protection transistor comprised in each interdigital loop, and the first transistor and the second transistor comprised in the control circuit are all PMOS transistors.

According to the electrostatic protection circuit provided in the present disclosure, optionally, the electrostatic protection circuit may further comprise a plurality of interdigital loops, and the interdigital loops are connected in parallel with each other, the gates of the electrostatic protection transistors in the interdigital loops are shorted to each other, and the body regions of the electrostatic protection transistors are shorted to each other.

According to another aspect of the present disclosure, a semiconductor structure corresponding to the electrostatic protection circuit is also provided herein.

The semiconductor structure provided in the present disclosure may comprise at least one transistor structure disposed between a first port and a second port that require electrostatic protection to form at least one interdigital loop in an electrostatic protection circuit, and the semiconductor structure may further comprise:

a semiconductor substrate;

a well region formed in the upper portion of the semiconductor substrate, and the well region defines a body region of the transistor structure;

at least one gate of the at least one transistor structure formed on the upper surface of the well region;

first doping type ion implantation regions respectively formed in the upper portions of the well region on both sides of the gate, and two of the first doping type ion implantation regions respectively defines the source and the drain of the transistor structure; and second doping type ion implantation regions formed at both ends of the well region, and the two second doping type ion implantation regions are respectively separated from the corresponding first doping type ion implantation regions by isolation media, and the second doping type ion implantation regions lead out the body region, and the drain is connected to the first port, and the source is connected to the second port;

each of the at least one gate and each of the second doping type ion implantation regions are connected to the output of the control circuit of the electrostatic protection circuit.

According to the semiconductor structure provided in the present disclosure, metal silicide blocking layers may be symmetrically formed on both sides of the upper surfaces of each gate, and the metal silicide blocking layer on each side may extend to a portion of the upper surface of the corresponding first doping type ion implantation region, and the metal silicide blocking layer defines a current limiting resistor connected either between the drain of the transistor structure and the first port, or between the source of the electrostatic protection transistor and the second port; and a metal silicide is formed on the remaining portion of the upper surface of each gate and the remaining portion of the upper surface of the first doping type ion implantation regions.

According to the semiconductor structure provided in the present disclosure, the semiconductor substrate may be doped with the first doping type, and the well region may be doped with the second doping type.

According to the semiconductor structure provided in the present disclosure, the first doping type may be an N type, and the second doping type may be a P type; or the first doping type may be a P type, and the second doping type may be an N type.

According to the semiconductor structure provided in the present disclosure, the upper surface of the well region may have a plurality of gates of the transistor structure formed thereon; and one of the first doping type ion implantation region is shared on the upper portion of the well region between every two of the gates.

Based on the above description, the present disclosure can utilize the control circuit to perform effective potential control on the gate and the body region of the electrostatic protection transistor, thereby overcoming the leakage problem during positive and negative voltage input, and utilize the current limiting resistor to enhance the two-way electrostatic protection capability of the electrostatic protection transistor.

BRIEF DESCRIPTION OF THE DRAWINGS

The above features and advantages of the present disclosure will be better understood after reading the detailed description of the embodiments of the present disclosure in conjunction with the following figures. In the figures, components are not necessarily drawn to scale, and components having similar related features may have the same or similar reference numerals.

REFERENCE SIGNS 110 first transistor
140 second transistor
114 first parasitic diode
144 second parasitic diode
21 NMOS electrostatic protection transistor
22 first current limiting resistor
23 second current limiting resistor
24 NMOS first transistor
25 NMOS second transistor
31 PMOS electrostatic protection transistor
32-33 current limiting resistor
34 PMOS first transistor
35 PMOS second transistor
41-4$n$ NMOS electrostatic protection transistor
411-41$n$ first current limiting resistor
421-42$n$ second current limiting resistor
4111 NMOS first transistor
4112 NMOS second transistor
51-5$n$ PMOS electrostatic protection transistor
511-51$n$ first current limiting resistor
521-52$n$ second current limiting resistor
5111 PMOS first transistor
5112 PMOS second transistor
60 N well
61 blocking layer
62 N type ion implantation region
63 metal silicide region
64 shallow trench isolation medium
65 P type semiconductor implantation region
66 P well
64 gate
68 metal silicide region
69 metal silicide region
90 internal circuit
VDD power source
VSS ground
I/O Pad bond pad
W/G control node
PAD1 first port
PAD2 second port

DETAILED DESCRIPTION OF THE INVENTION

The embodiments of the present disclosure are described in the following detailed description. On the contrary, the disclosure is described in connection with the embodiments so as to cover other alternatives or modifications that are possible in the embodiments of the present disclosure. In order to provide a thorough understanding of the present disclosure, many specific details are included in the following description. The present disclosure may also be practiced without these details. In addition, some specific details are omitted in the description in order to avoid confusing or obscuring the present disclosure.

In the description of the present disclosure, it should be noted that the terms "installation", "connecting", and "connected" should be understood broadly unless explicitly stated and defined otherwise. For example, the terms "installation", "connecting", and "connected" may be either a fixed connection, a detachable connection, or an integral connection; the terms may be either a mechanical connection or an electrical connection; the terms also may be either a direct connection, an indirect connection through an intermediate medium, or an internal connection between two components.

In addition, "up", "down", "left", "right", "top", "bottom", "horizontal", "vertical" used in the following description shall be understood as the orientation described in the paragraph and shown in the related figure. The relative term is used for convenience of description only, and does not mean that the device described therein is to be manufactured or operated in the specific orientation, and therefore should not be construed as limiting the present disclosure.

Understandably, although the terms "first", "second", "third", etc. may be used to describe various components, regions, layers and/or portions to distinguish different components, regions, layers and/or portions, the order of these components, regions, layers and/or portions described above should not be limited by the terms. Therefore, a first component, region, layer and/or portion mentioned below may be also mentioned as a second component, region, layer and/or portion without departing from some embodiments of the present disclosure.

Although the method is illustrated and described as a series of actions for the purpose of simplifying the explanation, it should be understood and appreciated that these methods are not limited by the order of the actions. Some actions may occur in different orders and/or concurrently with other actions that are illustrated and described herein or that are not illustrated and described herein, in accordance with one or more embodiments.

In order to solve the problem of leakage current when positive voltage or negative voltage is input, and the problem of weak capability on reverse electrostatic protection, the present disclosure provides an embodiment of electrostatic protection circuit that is compatible with both positive and negative voltage inputs, and capable of effectively performing two-way electrostatic protection, as well as an embodiment of corresponding semiconductor structure for same.

Figure 2:
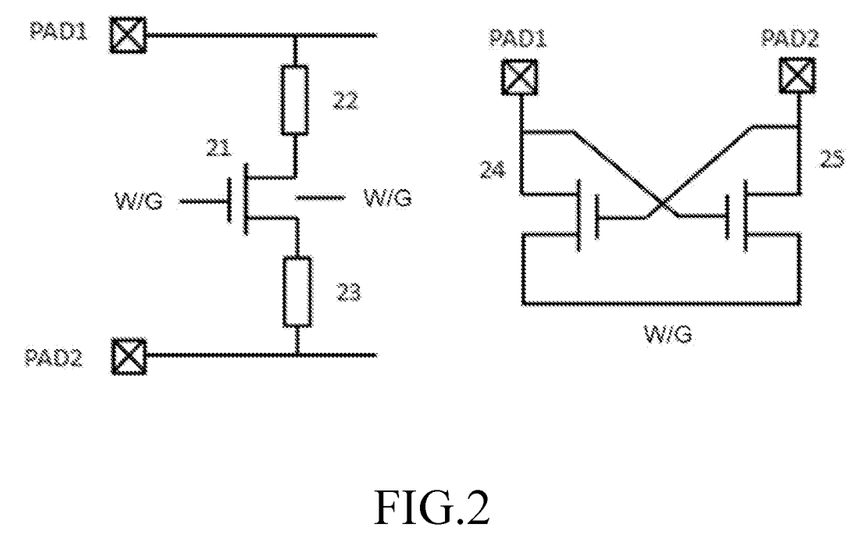
FIG. 2 shows an NMOS electrostatic protection circuit with single interdigital loop according to an embodiment of the present disclosure.

FIG. 2 shows an NMOS electrostatic protection circuit with single interdigital loop according to an embodiment of the present disclosure.

The electrostatic protection circuit with single interdigital loop according to the embodiment may be disposed between a first port PAD1 and a second port PAD2 that require electrostatic protection, and may comprise one interdigital loop and a control circuit electrically connected to the interdigital loop.

The interdigital loop may comprise an NMOS electrostatic protection transistor 21. The drain of the NMOS electrostatic protection transistor 21 may be electrically connected to the first port PAD1 via a first current limiting resistor 22. The source of the NMOS electrostatic protection transistor 21 may be electrically connected to the second port PAD2 via a second current limiting resistor 23.

The control circuit may comprise an NMOS first transistor 24 and an NMOS second transistor 25. A drain of the NMOS first transistor 24 and a gate of the NMOS second transistor 25 are electrically connected to the first port PAD1. A drain of the NMOS second transistor 25 and a gate of the NMOS first transistor 24 are electrically connected to the second port PAD2. A source of the NMOS first transistor 24 and a source of the NMOS second transistor 25 are shorted to the control node W/G, and electrically connected to a gate and a body region of the NMOS electrostatic protection transistor 21.

In the case that the integrated circuit provided in the embodiment works normally, the interdigital loop of the electrostatic protection circuit sleeps, and does not affect the integrated circuit.

When the voltage of the first port PAD1 is 3.3V and the voltage of the second port PAD2 is 0V, the voltage of the control node W/G should be 0V. Conversely, when the voltage of the first port PAD1 is −3.3V and the voltage of the second port PAD2 is 0V, the voltage of the control node W/G should be −3.3V.

In other words, according to the electrostatic protection circuit with single interdigital loop consisting of NMOS transistors, no matter whether positive or negative voltage input is received by the electrostatic protection circuit with single interdigital loop, the control node W/G voltage, namely the gate voltage and the body region voltage of the NMOS electrostatic protection transistor 21 will always coincide with the lower voltage of the first port PAD1 and the second port PAD2. Therefore, by providing the control circuit, the electrostatic protection circuit with single interdigital loop may effectively overcome the leakage current problem caused by the parasitic diode of the NMOS electrostatic protection transistor 21.

Since the body region of the NMOS electrostatic protection transistor 21 is directly connected to the control node W/G, and the interdigital loop has a symmetrical structure, the interdigital loop of the electrostatic protection circuit may be activated no matter whether the electrostatic discharge (ESD) is generated at the first port PAD1 or the second port PAD2. Through the reverse breakdown of the parasitic diode in the NMOS electrostatic protection transistor 21, the first port PAD1 and the second port PAD2 may be turned on to discharge the current generated by the ESD, thereby solving the problem of weak reverse electrostatic protection capability in the prior art.

With respect to the electrostatic protection circuit with single interdigital loop according to the embodiment, the first current limiting resistor 22 and the second current limiting resistor 23 may be resistor elements directly fabricated on the NMOS electrostatic protection transistor 21 by a semiconductor process. By providing the first current limiting resistor 22 and the second current limiting resistor 23, the current uniformity flowing through the NMOS electrostatic protection transistor 21 can be improved, thereby improving the discharge capability of the NMOS electrostatic protection transistor 21.

The resistance of the first current limiting resistor 22 and the second current limiting resistor 23 may be set same to further improve the current uniformity flowing through the source and the drain of the NMOS electrostatic protection transistor 21, thereby further improving the discharge capability of the NMOS electrostatic protection transistor 21.

In some embodiments, the NMOS electrostatic protection transistor 21, the NMOS first transistor 24 and the NMOS second transistor 25 provided in this embodiment are specific schemes of the embodiment. In other embodiments, the electrostatic protection transistor, the first transistor, and the second transistor may also employ other transistors of the same type to overcome the leakage current problem caused by the parasitic diode of the electrostatic protection transistor, and the weak reverse electrostatic protection capability of the prior art.

In some embodiments, the first current limiting resistor 22 and the second current limiting resistor 23 are in accordance with some embodiments. In other embodiments, the leakage current problem of the electrostatic protection transistor, and the weak reverse electrostatic protection capability of the prior art may also be overcome, even if the current limiting resistors are not used, or a first current limiting resistor and a second current limiting resistor with different resistance are used.

Figure 3:
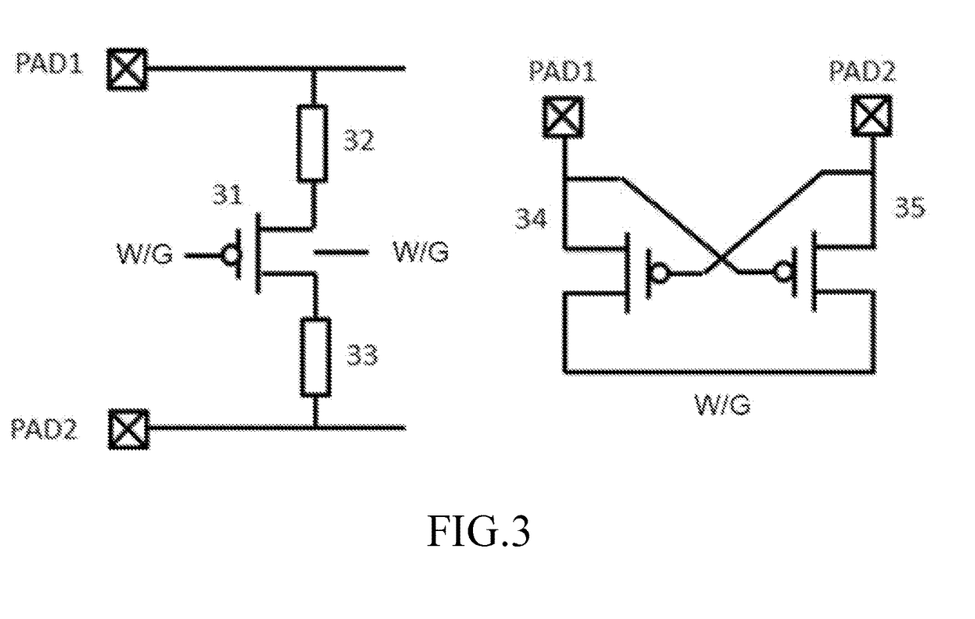
FIG. 3 shows a PMOS electrostatic protection circuit with single interdigital loop according to an embodiment of the present disclosure.

FIG. 3 shows a PMOS electrostatic protection circuit with single interdigital loop according to an embodiment of the present disclosure.

The electrostatic protection circuit with single interdigital loop according to the embodiment may be disposed between a first port PAD1 and a second port PAD2 that require electrostatic protection, and may comprise one interdigital loop and a control circuit electrically connected to the interdigital loop.

The interdigital loop may comprise a PMOS electrostatic protection transistor 31. A drain of the PMOS electrostatic protection transistor 31 may be electrically connected to the first port PAD1 via a first current limiting resistor 32. A source of the PMOS electrostatic protection transistor 31 may be electrically connected to the second port PAD2 via a second current limiting resistor 33.

The control circuit may comprise a PMOS first transistor 34 and a PMOS second transistor 35. A drain of the PMOS first transistor 34 and a gate of the PMOS second transistor 35 are electrically connected to the first port PAD1. A drain of the PMOS second transistor 35 and a gate of the PMOS first transistor 34 are electrically connected to the second port PAD2. A source of the PMOS first transistor 34 and a source of the PMOS second transistor 35 are shorted to the control node W/G, and electrically connected to a gate and a body region of the PMOS electrostatic protection transistor 31.

In the case that the integrated circuit provided in the embodiment works normally, the interdigital loop of the electrostatic protection circuit sleeps, and does not affect the integrated circuit.

According to the electrostatic protection circuit with single interdigital loop consisting of PMOS transistors, no matter whether positive or negative voltage input is received by the electrostatic protection circuit with single interdigital loop, the control node W/G voltage, namely the gate voltage and the body region voltage of the PMOS electrostatic protection transistor 31 will always coincide with the higher voltage of the first port PAD1 and the second port PAD2. Therefore, the electrostatic protection circuit with single interdigital loop may effectively overcome the leakage current problem caused by the parasitic diode of the PMOS electrostatic protection transistor 31.

Since the body region of the PMOS electrostatic protection transistor 31 is directly connected to the control node W/G, and the interdigital loop has a symmetrical structure, the interdigital loop of the electrostatic protection circuit may be activated no matter whether the electrostatic discharge (ESD) is generated at the first port PAD1 or the second port PAD2. Through the reverse breakdown of the parasitic diode in the PMOS electrostatic protection transistor 31, the first port PAD1 and the second port PAD2 may be turned on to discharge the current generated by the ESD, thereby solving the problem of weak reverse electrostatic protection capability in the prior art.

In some embodiments, the two embodiments of the electrostatic protection circuit with single interdigital loop described above are two specific aspects of the present disclosure. In other embodiments, the electrostatic protection circuit may further comprise a plurality of interdigital loops and/or a plurality of control circuits to overcome the leakage current problem caused by the parasitic diode of the electrostatic protection transistor, and the weak reverse electrostatic protection capability of the prior art.

Figure 4:
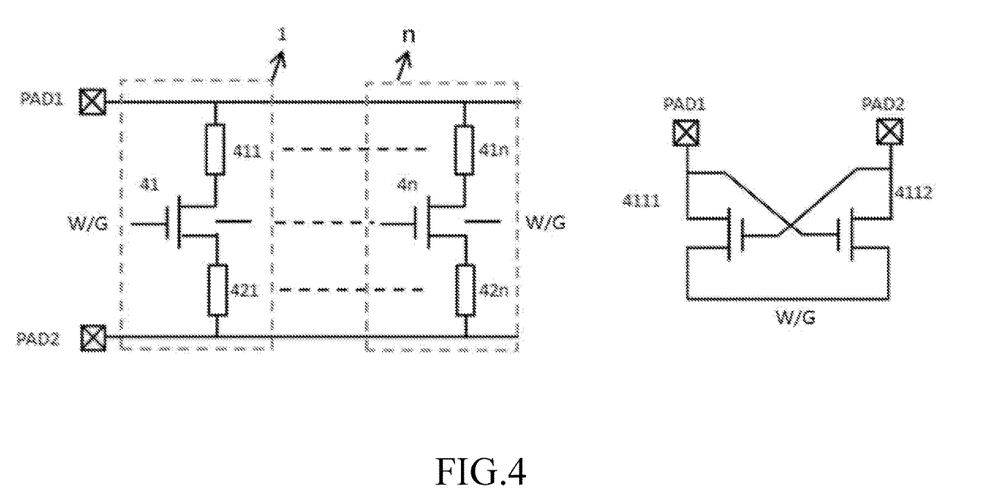
FIG. 4 shows an NMOS electrostatic protection circuit with multi interdigital loop according to an embodiment of the present disclosure.

FIG. 4 shows the embodiment of an NMOS electrostatic protection circuit with multi-interdigital loop provided by the present disclosure.

The electrostatic protection circuit with multi-interdigital loop according to the embodiment may be disposed between a first port PAD1 and a second port PAD2 that require electrostatic protection, and may comprise a plurality of interdigital loops and a control circuit electrically connected to the interdigital loops.

The plurality of interdigital loops are connected in parallel. The gates of the NMOS electrostatic protection transistors 41-4$n$ in the interdigital loops are shorted to each other such that the gates of the NMOS electrostatic protection transistors 41-4$n$ are at same potential. The body regions of the NMOS electrostatic protection transistors 41-4$n$ are shorted to each other such that the body regions of the NMOS electrostatic protection transistors 41-4$n$ are at same potential.

The parallel connection may mean that the drains of the NMOS electrostatic protection transistors 41-4$n$ are all connected to the first port PAD1, and the sources of the NMOS electrostatic protection transistors 41-4$n$ are all connected to the second port PAD2.

The NMOS electrostatic protection transistor 41, the first current limiting resistor 411, and the second current limiting resistor 421 may constitute a first interdigital loop. The NMOS electrostatic protection transistor 4$n$, the first current limiting resistor 41$n$, and the second current limiting resistor 42$n$ may constitute an nth interdigital loop. Understandably, the second to the n–1th interdigital loops are connected in the same manner as the first and the nth interdigital loop, thereby omitted in FIG. 4. The omission does not mean that the second to the n–1th interdigital loops must not exist.

The n interdigital loops may share one control circuit, and the control circuit may comprise an NMOS first transistor 4111 and an NMOS second transistor 4112. The drain of the NMOS first transistor 4111 and the gate of the NMOS second transistor 4112 are electrically connected to the first port PAD1. The drain of the NMOS second transistor 4112 and the gate of the NMOS first transistor 4111 are electrically connected to the second port PAD2. The source of the NMOS first transistor 4111 and the source of the NMOS second transistor 4112 are shorted to the control node W/G. All of the gates and the body regions of the NMOS electrostatic protection transistors 41-4$n$ may be connected to the control node W/G of the control circuit.

In the case that the integrated circuit of the embodiment works normally, the interdigital loops of the electrostatic protection circuit sleep, and do not affect the integrated circuit.

As the electrostatic protection circuit with multi-interdigital loop consisting of NMOS transistors, no matter whether positive or negative voltage input is received by the electrostatic protection circuit with multi-interdigital loop, the control node W/G voltage, as well as the gate voltage and the body region voltage of the NMOS electrostatic protection transistors 41-4$n$ will always coincide with the lower voltage of the first port PAD1 and the second port PAD2. Therefore, the electrostatic protection circuit with multi-interdigital loop may effectively overcome the leakage current problem caused by the parasitic diodes of the NMOS electrostatic protection transistors 41-4$n$.

The multi-interdigital loop with symmetrical structure may be activated no matter whether the ESD is generated at the first port PAD1 or the second port PAD2. Through the reverse breakdown of the parasitic diodes in the NMOS electrostatic protection transistors 41-4$n$, the first port PAD1 and the second port PAD2 may be turned on to discharge the current generated by the ESD, thereby solving the problem of weak reverse electrostatic protection capability in the prior art.

By providing a plurality of the interdigital loops connected in parallel, the discharge capacity of the electrostatic protection circuit may be multiplied, and the layout design of the electrostatic protection circuit may be optimized, thereby further improving the protection effect on the integrated circuit.

With respect to the electrostatic protection circuit with multi-interdigital loop according to the embodiment, the first current limiting resistors 411-41$n$ and the second current limiting resistors 421-42$n$ may be resistor elements directly fabricated on the NMOS electrostatic protection transistors 41-4$n$ by a semiconductor process.

By providing the first current limiting resistor 411-41$n$ and the second current limiting resistor 421-42$n$ in the electrostatic protection circuit with multi-interdigital loop, the current uniformity flowing through the NMOS electrostatic protection transistors 41-4$n$ can be improved, thereby improving the discharge capability of the NMOS electrostatic protection transistor 41-4$n$.

In some embodiments, the NMOS electrostatic protection transistors 41-4$n$, the NMOS first transistor 4111 and the NMOS second transistor 4112 provided in this embodiment are specific schemes of the embodiment. In other embodiments, the electrostatic protection transistors, the first transistor, and the second transistor may also employ other transistors of same types to overcome the leakage current problem caused by the parasitic diodes of the electrostatic protection transistors, and the weak reverse electrostatic protection capability of the prior art.

In some embodiments, the control circuit comprising the NMOS first transistor 4111 and the NMOS second transistor 4112 is mainly used to control the gate voltage and the body region voltage of the NMOS electrostatic protection transistors 41-4$n$. The number of the control circuits is not necessarily one. In other embodiments, a plurality of the control circuits may also be utilized in an electrostatic protection circuit.

Figure 5:
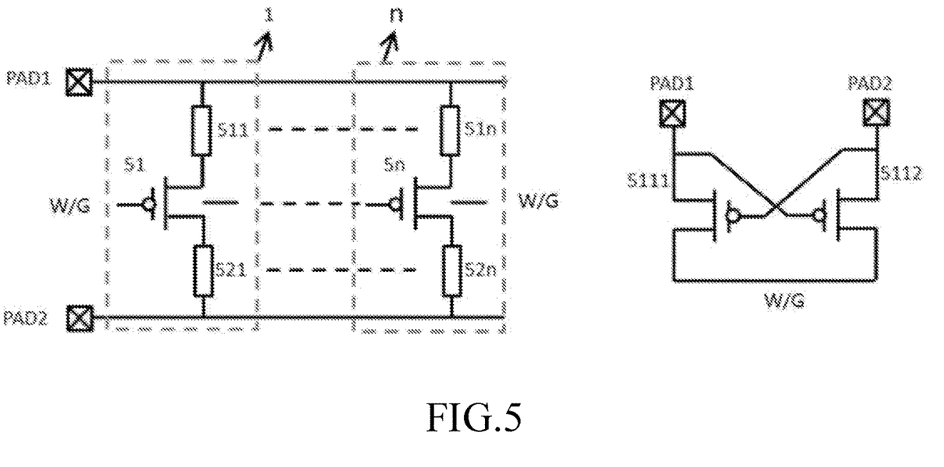
FIG. 5 shows a PMOS electrostatic protection circuit with multi interdigital loop according to an embodiment of the present disclosure.

FIG. 5 shows a PMOS electrostatic protection circuit with multi-interdigital loop according to an embodiment of the present disclosure.

The electrostatic protection circuit with multi-interdigital loop according to the embodiment may be disposed between a first port PAD1 and a second port PAD2 that require electrostatic protection, and may comprise a plurality of interdigital loops and a control circuit electrically connected to the interdigital loops.

The plurality of interdigital loops are connected in parallel. The gates of the PMOS electrostatic protection transistors 51-5$n$ in the interdigital loops are shorted to each other such that the gates of the PMOS electrostatic protection transistors 51-5$n$ are at same potential. The body regions of the PMOS electrostatic protection transistors 51-5$n$ are shorted to each other such that the body regions of the PMOS electrostatic protection transistors 51-5$n$ are at same potential.

The PMOS electrostatic protection transistor 51, the first current limiting resistor 511, and the second current limiting resistor 521 may constitute a first interdigital loop. The PMOS electrostatic protection transistor 5$n$, the first current limiting resistor 51$n$, and the second current limiting resistor 52$n$ may constitute an nth interdigital loop. Understandably, the second to the n−1th interdigital loops are connected in the same manner as the first and the nth interdigital loop, thereby omitted in FIG. 5. The omission does not mean that the second to the n−1th interdigital loops must not exist.

The n interdigital loops may share one control circuit, and the control circuit may comprise a PMOS first transistor 5111 and a PMOS second transistor 5112. The drain of the PMOS first transistor 5111 and the gate of the PMOS second transistor 5112 are electrically connected to the first port PAD1. The drain of the PMOS second transistor 5112 and the gate of the PMOS first transistor 5111 are electrically connected to the second port PAD2. The source of the PMOS first transistor 5111 and the source of the PMOS second transistor 5112 are shorted to the control node W/G. All of the gates and the body regions of the PMOS electrostatic protection transistors 51-5$n$ may be connected to the control node W/G of the control circuit.

In the case that the integrated circuit of the embodiment works normally, the interdigital loops of the electrostatic protection circuit sleep, and do not affect the integrated circuit.

With respect to the electrostatic protection circuit with multi interdigital loop consisting of PMOS transistors, no matter whether positive or negative voltage input is received by the electrostatic protection circuit with multi interdigital loop, the control node W/G voltage, namely the gate voltage and the body region voltage of the PMOS electrostatic protection transistors 51-5$n$ will always coincide with the higher voltage of the first port PAD1 and the second port PAD2. Therefore, the electrostatic protection circuit with multi-interdigital loop may effectively overcome the leakage current problem caused by the parasitic diodes of the PMOS electrostatic protection transistors 51-5$n$.

The multi-interdigital loop with symmetrical structure may be activated no matter whether the ESD is generated at the first port PAD1 or the second port PAD2. Through the reverse breakdown of the parasitic diodes in the PMOS electrostatic protection transistors 51-5$n$, the first port PAD1 and the second port PAD2 may be turned on to discharge the current generated by the ESD, thereby solving the problem of weak reverse electrostatic protection capability in the prior art.

According to another aspect of the present disclosure, a semiconductor structure corresponding to an NMOS electrostatic protection circuit with double interdigital loop is also provided herein according to an embodiment.

Figure 6:
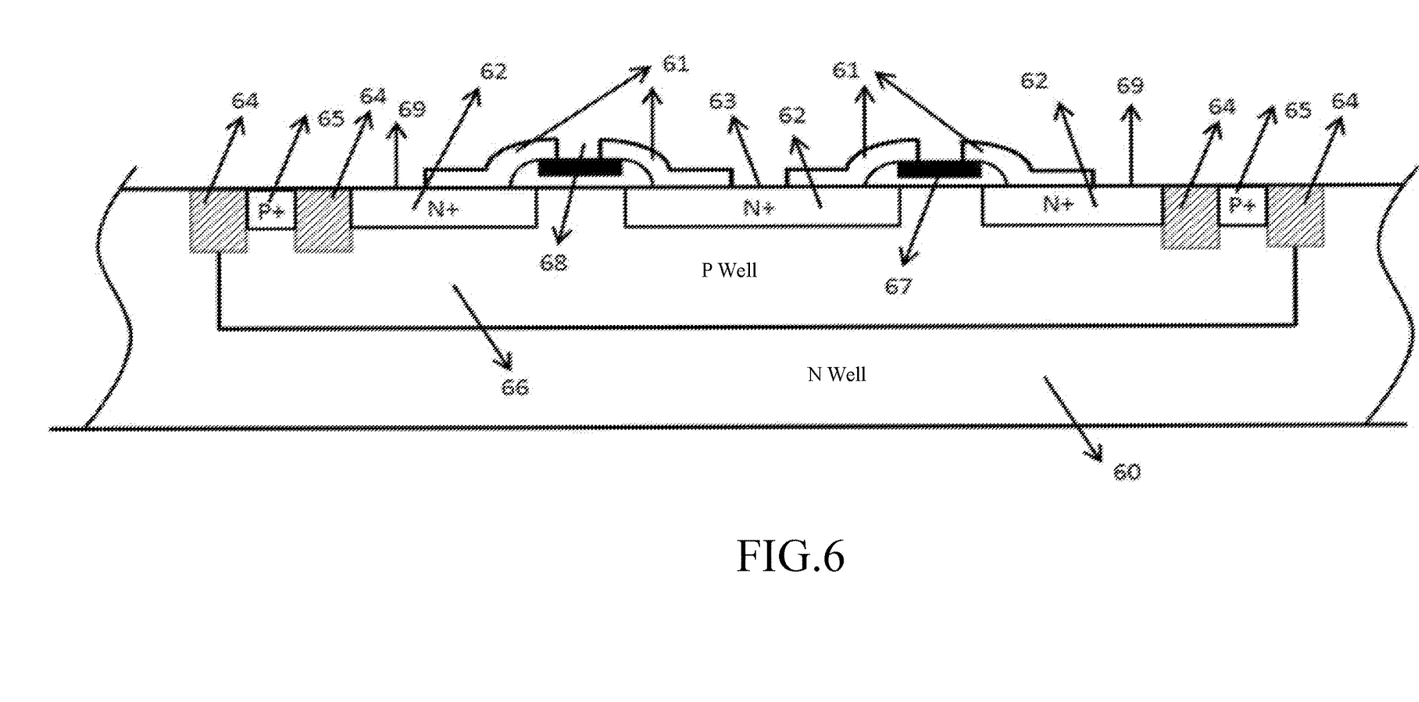
FIG. 6 shows the structure of the NMOS double interdigital loop according to an embodiment of the present disclosure.

As shown in FIG. 6, the semiconductor structure according to the embodiment may comprise two NMOS electrostatic protection transistor structures. The NMOS electrostatic protection transistor structures may be disposed between a first port PAD1 and a second port PAD2 that require electrostatic protection to form two interdigital loops in the electrostatic protection circuit.

The semiconductor structure of the embodiment may further comprise:

a N type doped semiconductor substrate;

a P well 66 formed in the upper portion of the semiconductor substrate, and the P well 66 defines a body region of the transistor structure;

polysilicon gates 67 of the two NMOS electrostatic protection transistor structures formed on the upper surface of the P well 66;

N type ion implantation regions 62 respectively formed in the upper portions of the P well 66 on both sides of each gate 67, and two of the N type ion implantation regions 62 respectively define the sources and the drains of the NMOS electrostatic protection transistor structures; and P type ion implantation regions 65 formed at both ends of the P well 66, and the two P type ion implantation regions 65 are respectively separated from the corresponding N type ion implantation regions 62 by shallow trench isolation media 64, and the P type ion implantation regions 65 lead out the body region of the P well 66, and the drains are connected to the first port PAD1, and the sources are connected to the second port PAD2;

each of the two gates 67 and each of the P type ion implantation regions 65 are connected to the control node W/G of the control circuit of the electrostatic protection circuit.

With respect to the semiconductor structure of the embodiment, the two NMOS electrostatic protection transistors may share one N type ion implantation region 62. The upper portions of the P wells 66 on both outer sides of the two gates 67 have other two N type ion implantation regions 62 formed therein. The shared N type ion implantation region 62 and the N type ion implantation regions 62 on both outer sides respectively define the sources or the drains of the NMOS electrostatic protection transistor structures.

The body region 66 of the NMOS electrostatic protection transistor is isolated from the source by the N well 60. Further, the body region 66 of the NMOS electrostatic protection transistor is connected to the control node W/G of the control circuit of the NMOS electrostatic protection circuit via the P type ion implantation regions 65.

A metal silicide blocking layer 61 may be symmetrically formed on both sides of the upper surface of each gate 67. The metal silicide blocking layer 61 on each side may further extend to a portion of the upper surface of the corresponding N type ion implantation region 62 for blocking the formation of the metal silicide.

The metal silicide blocking layer 61 defines the current limiting resistor connected between the drain of the NMOS electrostatic protection transistor structure and the first port PAD1, or between the source of the NMOS electrostatic protection transistor and the second port PAD2.

Metal silicide may be formed on the remaining portion 68 of the upper surface of each gate 67 and the remaining portions 63, 69 of the upper surface of the N type ion implantation region 62 to reduce the parasitic resistance of the polysilicon gate.

In some embodiments, the semiconductor structure corresponding to an NMOS electrostatic protection circuit with double interdigital loop is a specific embodiment. In other embodiments, the electrostatic protection circuit may also be an NMOS electrostatic protection circuit with multi-interdigital loop, and the upper surface of the P well may have a plurality of gates of the NMOS transistor structure formed thereon.

A plurality of shared ion implantation regions may be formed in the upper portions of the P well between the gates, and the shared ion implantation regions are N type doped. An N type ion implantation region may be formed in the upper portion of the P well on each of the two outer sides of the gates respectively. The shared N type ion implantation regions and the two N type ion implantation regions on both outer sides define the sources or the drains of the NMOS electrostatic protection transistor structures.

In other embodiments, the electrostatic protection transistors may also be PMOS electrostatic protection transistors.

Corresponding to the embodiment of PMOS electrostatic protection transistors, the semiconductor substrate may be P type doped, and the well region in the upper portion of the semiconductor substrate may also be an N well.

The ion implantation regions in the upper portion of the well region on both sides of the gates may be P type doped, and the two P type ion implantation regions respectively define a source and a drain of the transistor structure.

The ion implantation regions at both ends of the N well may be N type doped, and the two N type ion implantation regions are respectively separated from the corresponding P type ion implantation regions by shallow trench isolation media, and the N type ion implantation regions lead out the body region.

Each of the gates and the N type ion implantation regions are connected to the control node of the control circuit of the PMOS electrostatic protection circuit.

Based on the above description, the present disclosure can utilize the control circuit to perform effective potential control on the gate and the body region of the electrostatic protection transistor, thereby overcoming the leakage problem during positive and negative voltage input, and utilize the current limiting resistor to enhance the two-way electrostatic protection capability of the electrostatic protection transistor.

What is claimed is:

1. An electrostatic protection circuit disposed between a first port and a second port that require electrostatic protection, comprising:

at least one interdigital loop and a control circuit electrically connected to the at least one interdigital loop; wherein each of the at least one interdigital loops comprises an electrostatic protection transistor, wherein a drain of the electrostatic protection transistor is electrically connected to the first port, and a source of the electrostatic protection transistor is electrically connected to the second port;

the control circuit comprises a first transistor and a second transistor, wherein a drain of the first transistor and a gate of the second transistor are electrically connected to the first port, a drain of the second transistor and a gate of the first transistor are electrically connected to the second port, and a source of the first transistor is shorted to a source of the second transistor and electrically connected to a gate and a body region of the electrostatic protection transistor.

2. The electrostatic protection circuit of claim 1, wherein each of the at least one interdigital loops further comprises a first current limiting resistor connected between the drain of the electrostatic protection transistor and the first port, and a second current limiting resistor connected between the source of the electrostatic protection transistor and the second port.

3. The electrostatic protection circuit of claim 1, wherein the electrostatic protection transistor in each interdigital loop, and the first transistor and the second transistor in the control circuit are MOS transistors in same type.

4. The electrostatic protection circuit of claim 3, wherein the electrostatic protection transistor in each interdigital loop, and the first transistor and the second transistor in the control circuit are all NMOS transistors; or
   the electrostatic protection transistor in each interdigital loop, and the first transistor and the second transistor in the control circuit are all PMOS transistors.

5. The electrostatic protection circuit of claim 1, further comprising a plurality of interdigital loops, wherein the interdigital loops are connected in parallel with each other, the gates of the electrostatic protection transistors in the interdigital loops are shorted to each other, and the body regions of the electrostatic protection transistors are shorted to each other.

\* \* \* \* \*